United States Patent
Sakata (10) Patent No.: US 6,930,035 B2
(45) Date of Patent: Aug. 16, 2005

(54) SEMICONDUCTOR DEVICE FABRICATION METHOD

(75) Inventor: Toyokazu Sakata, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/747,148

(22) Filed: Dec. 30, 2003

(65) Prior Publication Data

US 2004/0266169 A1 Dec. 30, 2004

(30) Foreign Application Priority Data

Jun. 26, 2003 (JP) ........................................ 2003-183020

(51) Int. Cl.[7] .......................................... H01L 21/4763
(52) U.S. Cl. ..................... 438/622; 438/740; 438/743
(58) Field of Search ................................. 438/622, 703, 438/706, 720, 723, 738, 740, 743

(56) References Cited

U.S. PATENT DOCUMENTS

| | | | | |
|---|---|---|---|---|
| 6,140,167 A | * | 10/2000 | Gardner et al. | 438/197 |
| 6,355,572 B1 | | 3/2002 | Ikegami | |
| 6,458,708 B1 | * | 10/2002 | Jin | 438/703 |
| 6,777,307 B1 | * | 8/2004 | Ramkumar et al. | 438/424 |
| 6,781,192 B2 | * | 8/2004 | Farrar | 257/326 |
| 2002/0105086 A1 | | 8/2002 | Yoshie | |

FOREIGN PATENT DOCUMENTS

JP            10-284600          10/1998

* cited by examiner

Primary Examiner—Phuc T. Dang
(74) Attorney, Agent, or Firm—Rabin & Berdo, P.C.

(57) ABSTRACT

The present invention provides an auxiliary semiconductor device fabrication method that forms wiring 113 by using the wiring groove 108 that is formed in the sacrificial oxide film 104. An interlayer insulating film is formed by removing, by means of etching, the sacrificial oxide film that is used as a mold for the wiring layer formation and then allowing the porous Low-k film to fill the region from which the sacrificial oxide film has been removed.

10 Claims, 10 Drawing Sheets

SEMICONDUCTOR DEVICE FABRICATION METHOD

BACKGROUND OF THE INVENTION

1. Field of the Invention

The present invention relates to a semiconductor device, and, more particularly, to a method for fabricating a porous Low-k film of multi-layered wiring.

2. Description of Related Art

In recent years, in accordance with the demand to lower the power consumption and increase the speed of semiconductor devices, a need has arisen to lower the permittivity of interlayer insulating films. Particularly in the case of logic-based devices, the increased resistance caused by fine wiring and the increase in the wiring capacitance have been linked to degradation of the speed of the device, and hence there is now a need for fine multi-layered wiring whose interlayer insulating film is a low permittivity film. Currently, the most widely used interlayer insulating film in semiconductor devices is a silicon oxide film formed by Chemical Vapor Deposition (CVD) the relative permittivity value of this film being on the order of 4. SiOF, which contains fluorine atoms (relative permittivity=3.2 to 3.7 approximately), is well known as a low permittivity film that is deposited by using CVD. By terminating the Si—O—Si bond with an F atom, the permittivity of the material is reduced because of the reduced density thereof and the fact that the polarizability of the F atoms themselves is low, and so forth. Furthermore, organic SOG (SOG: Spin on Glass) and polyimide and so forth are well known as low dielectric materials that contain carbon atoms. Organic SOG is also referred to as silica-based organic coating film, and representative material examples include MSQ (methyl silsesquioxane) and HSG, and so forth. The density of these materials is reduced by the inclusion of carbon atoms, so-called alkyl groups, and it is said that low permittivity results from reducing the polarizability of the molecules themselves. The relative permittivity of these films is on the order of 2.5 to 3.5. The film deposition method generally used is a technique that involves coating the substrate uniformly by coating the substrate with an organic solution and then rotating the substrate at a high speed by using a spin coater, and finally drying (sintering) the solution by annealing the substrate at a temperature of 120° C. to 300° C.

Meanwhile, a method that reduces the permittivity by lowering the density has also been investigated. That is, this method involves lowering the density per unit volume to reduce the permittivity by including voids or air holes (bubbles) in a silicon oxide film or other film. Because the relative permittivity of the voids is 1, implementation is possible up to a relative permittivity that is on the order of 1.5 by increasing the void content. The void content here is on the order of 50% to 60%, varying according to the organic silica-based film type. Such a low permittivity insulating film that contains voids in the film is called a porous Low-k film. The voids are formed by adding a foaming agent as a porosity agent to the material, vaporizing the foaming agent by carrying out a heat treatment step such as curing, followed by decomposition. An organic silicon compound is generally used as the foaming agent. Foaming agents may also be in granular form, and there are also techniques such as that of diffusing a granular foaming agent in a film deposition material, coating this film deposition material on the substrate and then subjecting the same to a heat treatment to form voids in the film. Silica powder with a grain diameter of 1 to 50 nm or 5 to 15 nm is used as the granular foaming agent.

Furthermore, as an example in which a porous Low-k film is used as an interlayer insulating film, a method in which only a portion in the vicinity of a side wall face exposed to a wiring groove and via hole connecting hole of the interlayer insulating film is a porous Low-k film has also been proposed (Japanese Patent Application Laid Open No. 2002-231808 (paragraphs 0039 to 0043, FIG. 2), corresponding to U.S. Patent Application Publication No. US2002/0105086A1).

Figure 9A:
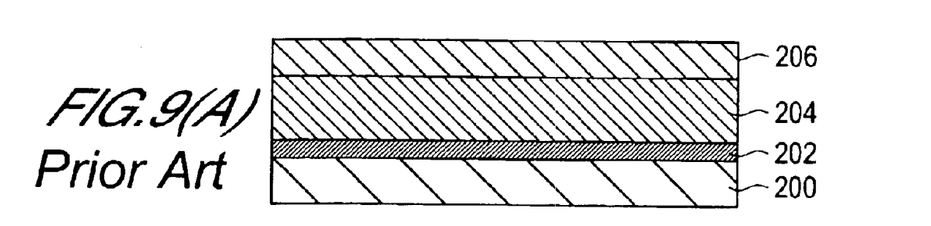
FIGS. 9(A) to 9(C) are explanatory views of a conventional multi-layered wiring fabrication process.
Figure 9B:
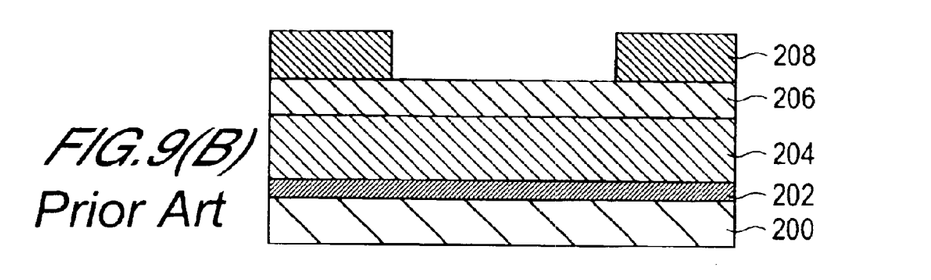
Figure 9C:
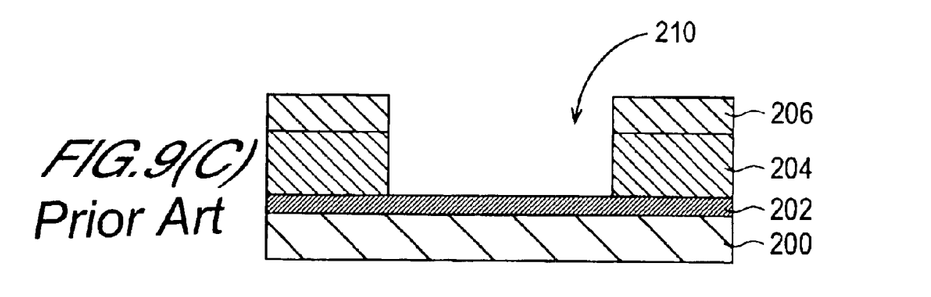
Figure 10A:
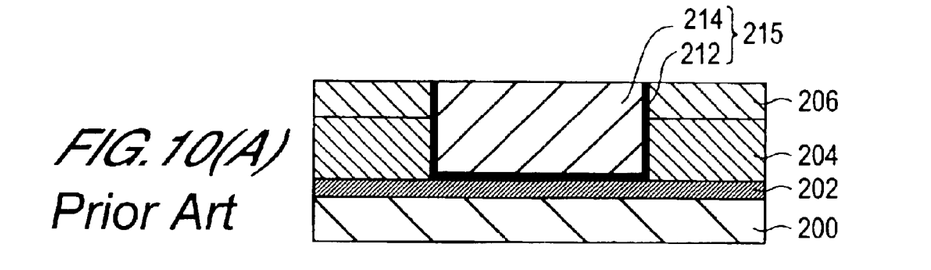
FIGS. 10(A) to 10(B) follow on from FIG. 9(C) and are explanatory views of the conventional multi-layered wiring fabrication process.
Figure 10B:
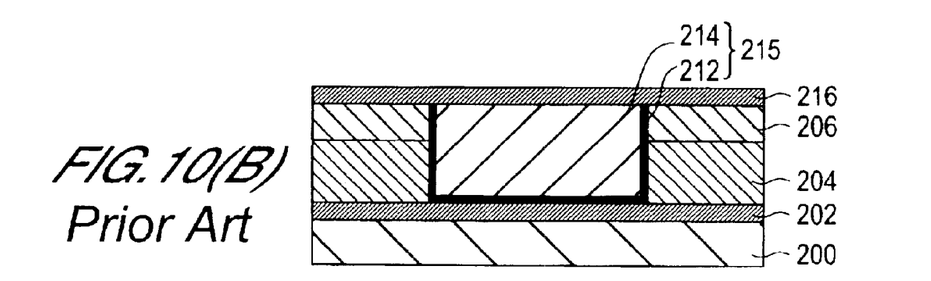

Here, a method for forming a multi-layered wiring film in which a general porous Low-k film is used as the interlayer insulating film will be described. FIGS. 9 and 10 are explanatory views of a process for fabricating multi-layered wiring in which a conventional porous Low-k film is used as the insulating film.

First of all, an etching stopper layer 202 for forming a wiring groove 210 is deposited on lower layer wiring 200. Here, as an example of the etching stopper layer, a silicon nitride film ($Si_3N_4$) 202 is employed. Then, a porous Low-k film 204 is deposited as an interlayer insulating film for forming the wiring groove 210 therethrough. Next, a silicon oxide film 206 constituting a hard mask is deposited (FIG. 9(A)). Next, patterning of a resist pattern 208 used for the wiring groove is performed by using a photolithographic technique (FIG. 9(B)). The inside of the wiring groove 210 is formed by etching the silicon oxide film 206 and the porous Low-k film 204, and the resist pattern 208 is then removed (FIG. 9(C)). The wiring groove 210 is chemically cleaned to remove impurities. Next, a barrier metal 212, a seed layer (not shown), and an electrically conductive layer 214 are formed in this order. Then excess metal is removed by polishing by means of Chemical Mechanical Polishing (CMP), thereby forming wiring 215 (FIG. 10(A)). Finally, a silicon nitride film 216 is deposited as a metal wiring cap film (FIG. 10(B)). The silicon nitride film 216 also functions as an etching stopper film for an upper wiring layer. Multi-layered wiring that uses a porous Low-k film is formed by repeating the steps described above.

However, the following three problems manifest themselves when an insulating film containing voids is applied to multi-layered wiring.

First, "1) Film quality degradation resulting from plasma irradiation during etching and ashing" may be cited as the very first problem. This problem is based on the fact that, generally, organic films such as the organic SOG mentioned above possess the property of being susceptible to a heat treatment in a plasma oxide atmosphere, thereby producing a variation in film quality (conversion to $SiO_2$ through compaction) during plasma oxide ashing to process the via hole and remove the resist and so forth. It is thought that this phenomenon is generated as a result of the oxygen radical (O*) in the plasma penetrating the film via the pattern side wall of the organic SOG film during ashing and then reacting with the alkyl groups within the film (methyl groups or similar). Hence there is the worry that, when the organic SOG film surface is processed directly by the oxygen-containing plasma in an etching and ashing step, the SOG film surface will modify the oxygen film and the permittivity will increase due to moisture absorption.

Next, "2) The penetration of chemical into the voids during cleaning" may be mentioned. This induces problems such as a short circuit between the wiring or interconnection as a result of the chemicals during the cleaning following the etching penetrating the interlayer insulating film via these voids on account of the exposure of the voids at the pattern side walls in the cleaning step following etching. This brings about the concern that the reliability and yield of the device will be affected as a result.

Further, the "3) Reduction in the coverage of the barrier metal caused by the voids" may be mentioned. Because the material containing voids in the film is etched, when contacts or similar are formed, it is to be expected that the surface of the pattern side wall will exhibit severe side wall unevenness that is caused by these voids. At these rough points of the pattern side wall, the coverage (surface coverage) of the film that is deposited subsequently is markedly reduced, and, therefore, when a film with an extremely thin film thickness is deposited as a barrier metal (20 to 50 nm), for example, points exist, depending on the location, in which the barrier metal is not formed. There is therefore the concern that, when a point that is partially uncovered by the barrier metal exists, copper or the like will be diffused within the insulating film as a result of a subsequent heat treatment or similar, thereby inducing a short circuit with the adjoining wiring or degradation of the device characteristics and so forth, and reducing the yield.

As a method for avoiding the above-described problems which are generated during formation of the above-described wiring layer, a method that involves forming a wiring groove and via hole connecting hole and then protecting the side walls of the porous Low-k film by means of a side wall has been proposed (Japanese Patent Application Laid-Open No. 10-284600 (paragraphs 0025 to 0032, FIG. 3)). Further, as another technique, a method that involves modifying the end surfaces of the insulating film by means of compaction has also been proposed (Japanese Patent Application Laid-Open No. 2001-77086 (paragraphs 0004 to 0005, FIG. 1), corresponding to U.S. Pat. No. 6,355,572).

However, both these techniques are techniques that cover the voids by forming a side wall or modified film and so forth, and hence there is the concern that, when points that are partially unprotected or unmodified exist, the porous Low-k film will be damaged.

Accordingly, there has been a desire for a method of overcoming the three problems mentioned above and of forming a multi-layered wiring film in which there is no damage to the porous Low-k film.

SUMMARY OF THE INVENTION

Therefore, as a result of extensive research, the inventor of this application reached the conclusion that the above problems could be resolved by forming an interlayer insulating film from a porous Low-k film after forming an electrically conductive layer.

The semiconductor device fabrication method of the present invention comprises the steps of: forming a wiring layer by using a sacrificial film, followed by removing the sacrificial film, when forming multi-layered wiring; and forming a low permittivity film as an interlayer insulating film in the region in which the sacrificial film is formed. Here, the sacrificial film is a mold for forming the wiring layer, and is removed by etching after the wiring layer has been formed. Further, an interlayer insulating film is formed by allowing a low permittivity film to fill the region in which the now removed sacrificial film was formed.

According to the semiconductor device fabrication method of the present invention, the interlayer insulating film, which constitutes a low permittivity film, is formed after the formation of the wiring layer. Accordingly, there is no exposure to the plasma processing or the chemical cleaning of the inside of the wiring groove. As a result, it is possible to form a favorable interlayer insulating film that is free of defects by means of a low permittivity film.

BRIEF DESCRIPTION OF THE DRAWINGS

The foregoings and other objects, features and advantageous of the present invention will be better understood from the following description taken in connection with the accompanying drawings, in which.

DESCRIPTION OF THE PREFERRED EMBODIMENTS

With reference to the drawings, embodiments of the present invention will be described below. Further, each of the drawings schematically shows a cross section of the structure that is obtained at each stage of the fabrication process. In each of the drawings, the size, shape, and dispositional relationship of the constituent elements forming the structure are shown schematically to an extent permitting an understanding of the present invention.

First Embodiment

FIGS. 1 and 2 are explanatory views of the multi-layered wiring fabrication process of the first embodiment of the present invention. In the first embodiment, the method for forming a single-layer wiring layer of the multi-layered wiring will be described. First of all, a silicon nitride film 102 is deposited as an etching stopper layer on top of lower wiring or interconnection 100. Then a sacrificial oxide film 104 is deposited as a wiring groove formation insulating film (FIG. 1(A)) Here, the sacrificial oxide film 104 is a sacrificial film that is deposited only in order to serve as a mold for the wiring formation. Next, a resist pattern 106 used for wiring groove etching is formed by patterning by means of a commonly known photolithographic technique (FIG. 1(B)). Next, a wiring groove 108 is formed by etching part of the sacrificial oxide film 104 that is exposed to the opening 106a in the resist pattern 106. Next, removal of the resist pattern 106 by means of ashing, and cleaning of the inside of the wiring groove 108 are performed (FIG. 1(C)). An organic release agent that is generally employed for the cleaning of the inside of the wiring groove is used. Then, a barrier metal 110, a seed layer 111 and an electrically conductive layer 112 are sequentially deposited in the wiring groove 108. The barrier metal and the seed layer 111 are provided on and following the inner wall faces of wiring groove 108. The barrier metal 110 is formed by depositing a tantalum nitride (TaN) film with a thickness of 50 ran, for example. The TaN film is formed under conditions which are a sputtering atmospheric pressure of 3 mTorr, 6 kW DC power, and a film deposition temperature of 150° C. by means of highly directional sputtering by using Ta as the target and Ar/$N_2$ mixed gas as the process gas, for example. Thereafter, the seed layer 111 is formed on the surface of the barrier metal. Here, a Cu seed layer with a thickness of 150 nm is formed, for example. The deposition of the Cu seed layer is performed under conditions which are a sputtering atmosphere of 2 mTorr, 12 kW DC power, and a film deposition temperature of 30° C. by means of highly directional sputtering by using Cu as the target and Ar gas as the process gas. Further, the electrically conductive layer 112 (here, a case is shown where copper is used as one example of the electrically conductive layer) is formed by performing Cu electrolytic plating on the seed layer 111 so that the wiring groove 108 is embedded. The electrolytic plating film is formed in a plating fluid that consists of copper sulfate ($CuSO_4 \cdot 5H_2O$), which constitutes the source of the Cu component separation, sulfuric acid ($H_2SO_4$), which increases the electrical conductivity, chlorine (Cl), which promotes dissolution of the soluble anode (phosphorus-containing copper, for example), and additives and so forth for increasing the embedding performance. The deposition of the plating film is performed under conditions which are a fluid temperature of 25° C. and a fixed electric current by using the above-mentioned plating fluid, for example.

Figure 1A:
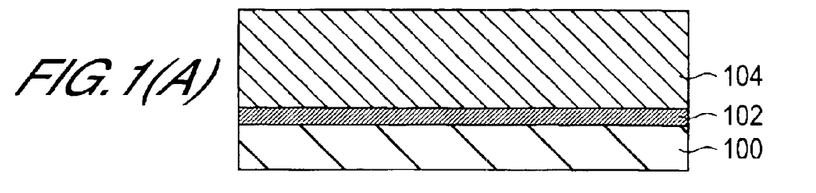
FIGS. 1(A) to 1(D) are explanatory views of the multi-layered wiring fabrication process of the first embodiment according to the present invention.
Figure 1B:
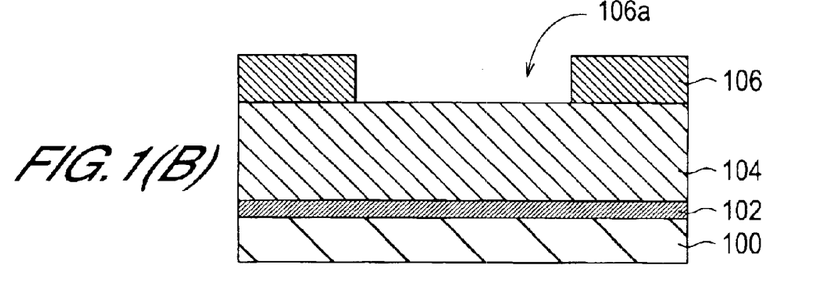
Figure 1C:
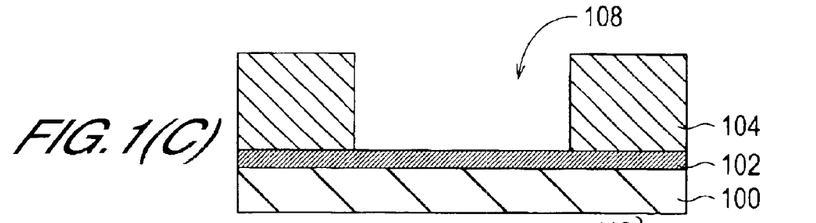
Figure 1D:
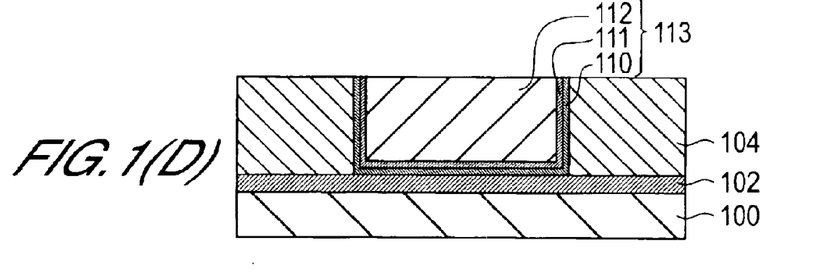
Figure 2A:
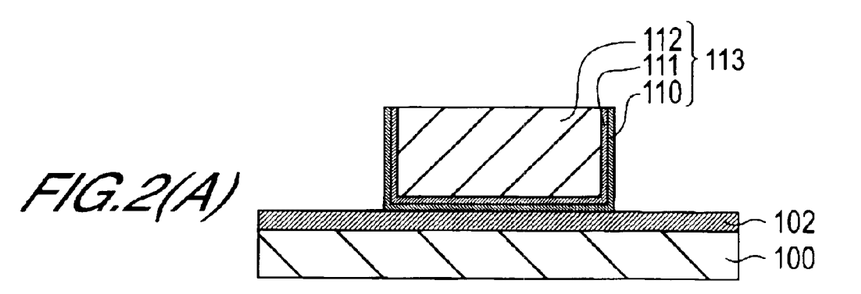
FIGS. 2(A) to 2(C) follow on from FIG. 1(D) and are explanatory views of the multi-layered wiring fabrication process of the first embodiment according to the present invention.
Figure 2B:
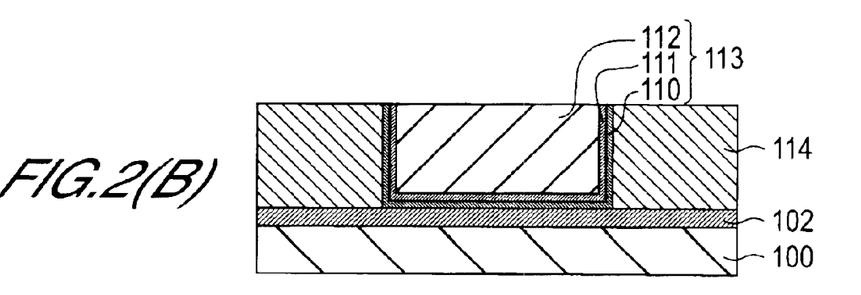

Thereafter, the excess electrically conductive layer on the surface of the film deposition layer is removed and made smooth by means of CMP (FIG. 1(D)). Wiring or interconnection 113 is constituted by the barrier metal 110, the seed layer 111 and the electrically conductive layer 112. The wiring 113 is equivalent to the wiring layer. Next, only the sacrificial oxide film 104 is removed by wet etching by means of hydrofluoric acid (0.3% HF solution, for example) (FIG. 2(A)). Further, in this embodiment, a method that involves removing only the sacrificial oxide film by wet etching by means of hydrofluoric acid is presented as an example, but the sacrificial oxide film may be removed by using isotropic or anisotropic dry etching. Thereafter, the region between the wiring already formed, that is, the region from which the sacrificial oxide film 104 has been removed, is filled with a porous Low-k film 114 (FIG. 2(B)). For example, a film deposition material in which a foaming agent has been mixed is dissolved in a solvent and is injected by coating the surface while rotating the whole wafer body. The solvent is vaporized by means of a heat treatment, and, at the same time, voids are formed in the film by the foaming agent, thereby forming the porous Low-k film. Citable examples of the film deposition material include, for example, PAE (poly(arylene ether)), MSQ (methyl silsesquioxane) and HSQ (hydrogen silsesquioxane), and the film deposition material may also be a material that can be formed by coating. Conditions adapted to each material are appropriately selected for the solvent used and the temperature of the heat treatment. Because the porous Low-k film can thus be formed so that the surface thereof is smooth and at a height that is at the same level as the surface of the wiring layer by means of coating, smoothing by CMP need not be performed.

Figure 2C:
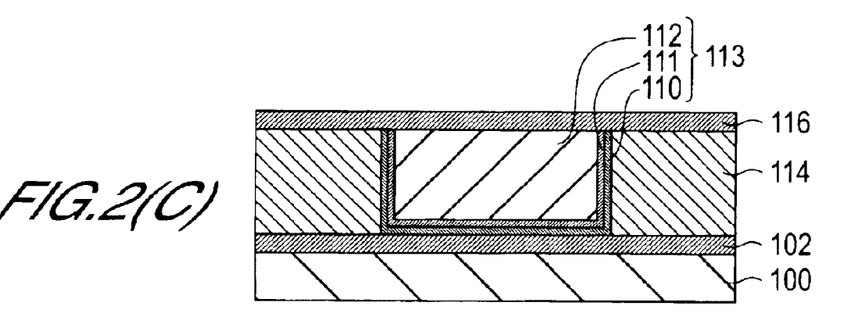

Finally, a silicon nitride film 116 is deposited as a cap layer (FIG. 2(C)). The silicon nitride film 116 thus formed as this cap layer also acts as an etching stopper film when the next wiring layer of the multi-layered wiring is formed. Accordingly, the multi-layered wiring can be formed by repeating the steps from the step of forming the sacrificial oxide film 104 to the step of forming the silicon nitride film 116 which acts as the cap layer.

In this embodiment, the porous Low-k film is formed by coating, but, this film can, depending on the film deposition material, also be formed by CVD by suitably selecting the film deposition conditions. Further, a wholly organic film or an organic-inorganic mixed film may be used as the sacrificial film.

According to the above first embodiment of the present invention, a wiring layer is formed by a sacrificial oxide film which is a silicon oxide film without voids, and then, once the sacrificial oxide film, which is used as a mold for the wiring layer, has been removed, a porous Low-k film is deposited once again as an interlayer insulating film. As a result, the porous Low-k film is not exposed to the plasma processing or to the chemicals used for the cleaning, whereby the problems caused by the voids during the wiring layer formation, which are problems exhibited by the conventional technology, can be completely avoided.

Furthermore, the etching conditions for the porous Low-k film differ greatly depending on the void content and the material. With the conventional fabrication method, because there is a step of etching the porous Low-k film, a study of the etching conditions has been necessary. With the fabrication method of the present invention, because the porous Low-k film is formed by filling the region from which the sacrificial oxide film 104 is removed by etching, an etching step is not required. Accordingly, even when a variety of porous Low-k films are used, there is no need to set etching conditions on every occasion, whereby the development time can be markedly shortened. In other words, even when the material of the porous Low-k film is changed, the fabrication method of the present invention can be applied as is without setting conditions.

In addition, because the porous Low-k film is formed after the wiring layer formation, there is no need to deposit a protective film such as a cap oxide film that serves to increase the mechanical strength with respect to CMP (Chemical Mechanical Polishing). Therefore, in comparison with the conventional method, substitution with a low permittivity film also equivalent to the cap oxide film is possible and hence the interwiring capacitance can be further reduced.

Where the number of steps is concerned, although the number of steps is newly increased by the deposition and removal of the sacrificial film used for wiring formation, because there is no need to form a side wall film or a protective film for the porous Low-k film that protects against plasma processing and the like, there is no marked increase in the number of steps in comparison with the conventional method.

Second Embodiment

A method that includes a step of protecting the wiring layer when the sacrificial oxide film is removed will now be described in a second embodiment of the present invention.

Figure 3A:
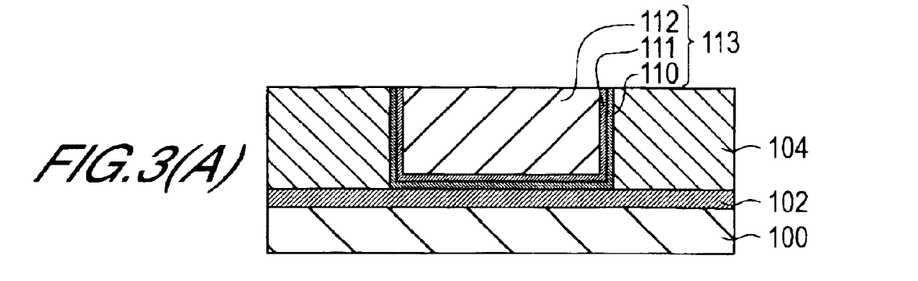
FIGS. 3(A) to 3(C) are explanatory views of the multi-layered wiring fabrication process of the second embodiment according to the present invention.
Figure 3B:
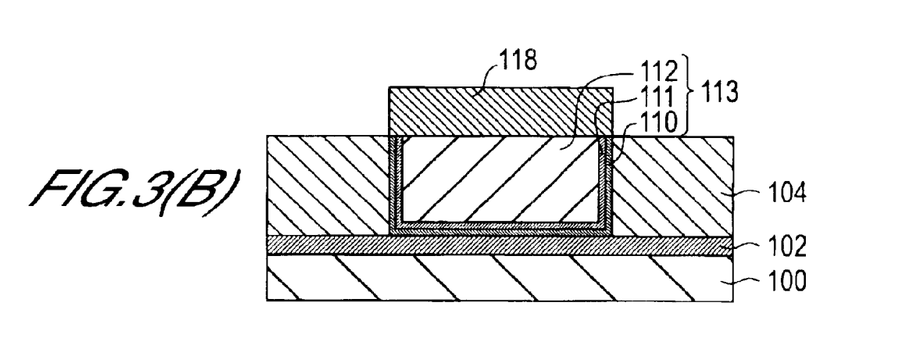
Figure 3C:
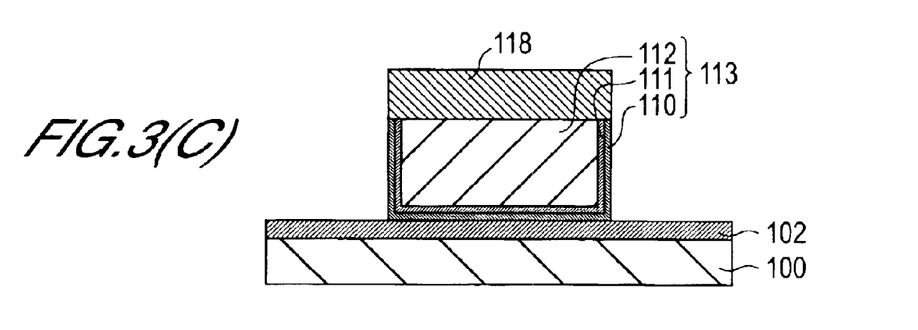
Figure 4A:
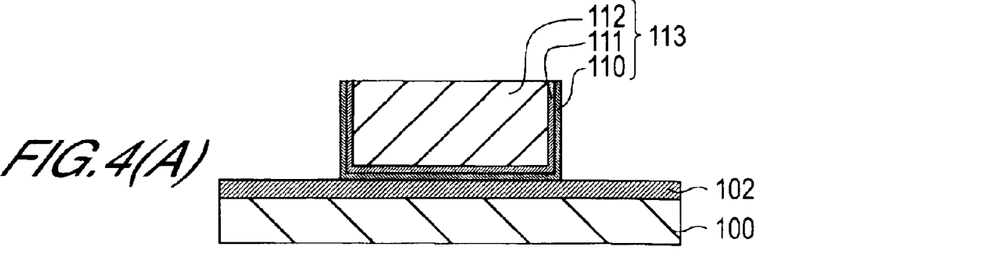
FIGS. 4(A) to 4(C) follow on from FIG. 3(C) and are explanatory views of the multi-layered wiring fabrication process of the second embodiment.

FIGS. 3 and 4 are explanatory views of the multi-layered wiring fabrication process according to the second embodiment of the present invention. The steps up until formation of the wiring 113 that is equivalent to a wiring layer are the same as those of the first embodiment, and hence a description of these steps will be omitted here. FIG. 3(A) shows a state where the wiring 113 of the first embodiment is formed and is equivalent to FIG. 1(D). Next, a resist pattern 118 is patterned by using a photolithographic technique on only the wiring 113 by using an inverse mask of the wiring groove pattern used for the formation of the wiring 113 (FIG. 3(B)). Here, the formation of the resist pattern 118 of the inverted pattern may be formed by reversal of a negative or positive resist, and may be formed by means of a mask of an inverse pattern resulting from the formation of the wiring layer. Further, so too for mask alignment, the resist pattern can be formed on the wiring layer alone through alignment by using ordinary alignment marks. Thereafter, only the sacrificial oxide film 104 is removed by dry etching (FIG. 3(C)). As the gas used for dry etching, a mixed gas that is a mixture of at least any one gas in a group containing oxygen, hydrogen, nitrogen, halogen, and an inert gas such as Ar, Xe, Kr, He may be used. Next, the resist pattern 118 on the wiring 113 is removed by ashing (FIG. 4(A)). Here, when copper is used for the electrically conductive layer, because the copper wiring is oxidized by the oxygen in the ashing, the resist pattern is removed by ashing by means of a gas that does not contain oxygen, such as $N_2/H_2$ or $NH_3$, so that the wiring material is not oxidized. Further, when this embodiment is used with wiring other than copper wiring, there is no problem even when the resist pattern is removed by using oxygen or similar.

Figure 4B:
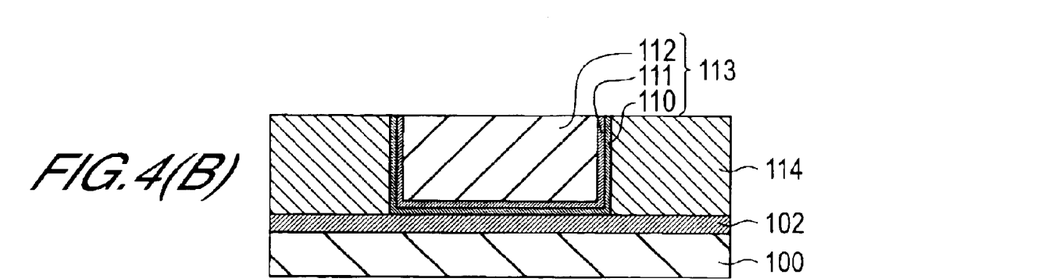
Figure 4C:
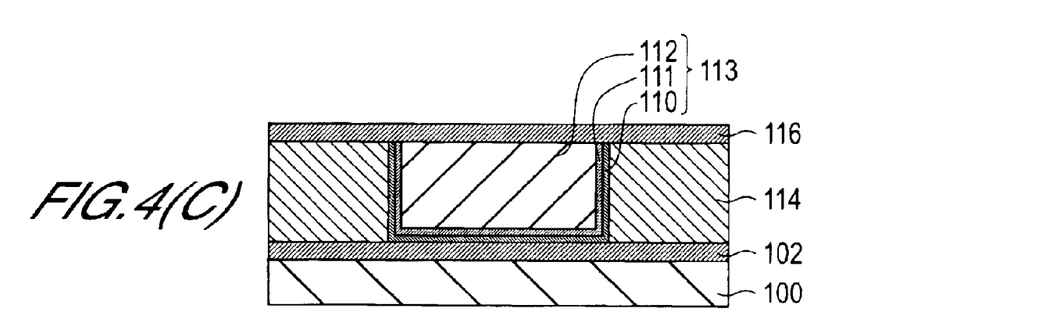
Figure 5A:
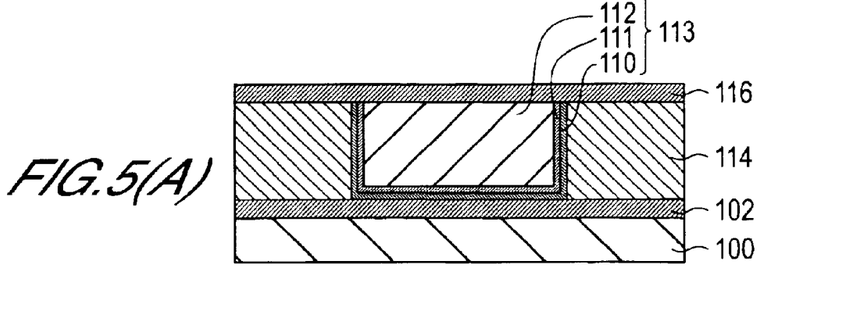
FIGS. 5(A) to 5(C) are explanatory views of the multi-layered wiring fabrication process of the third embodiment according to the present invention.
Figure 5B:
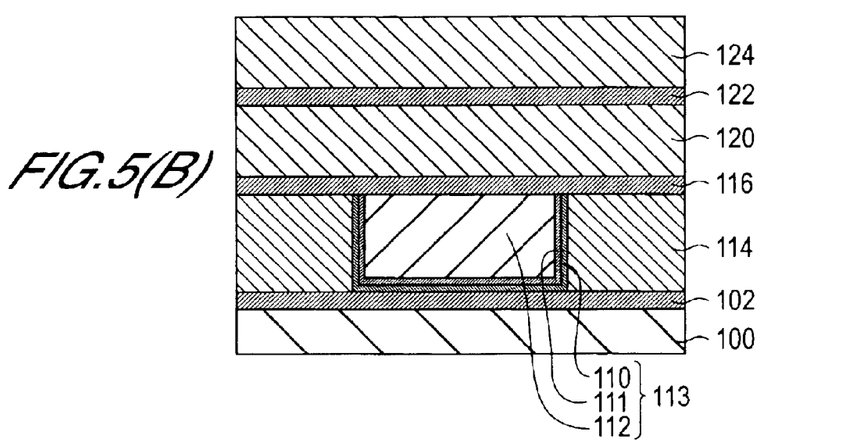
Figure 5C:
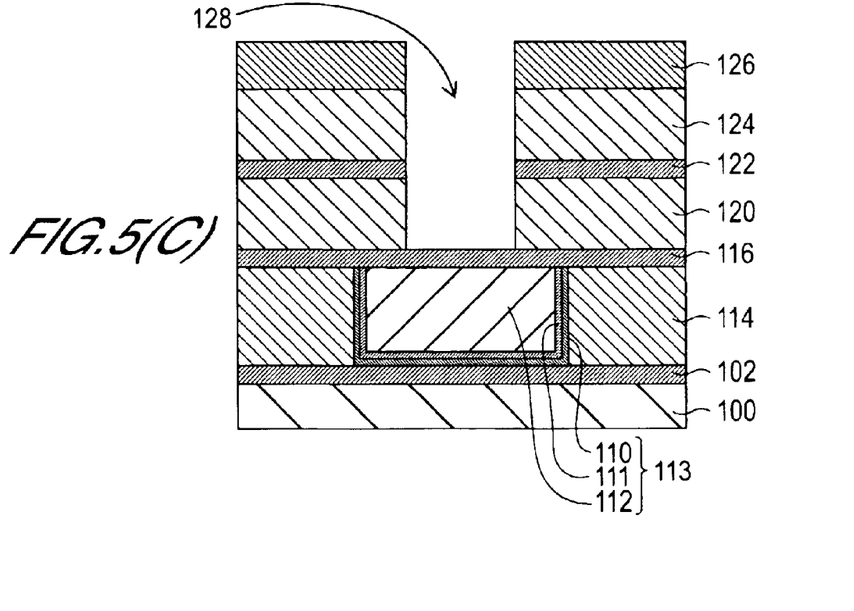
Figure 6A:
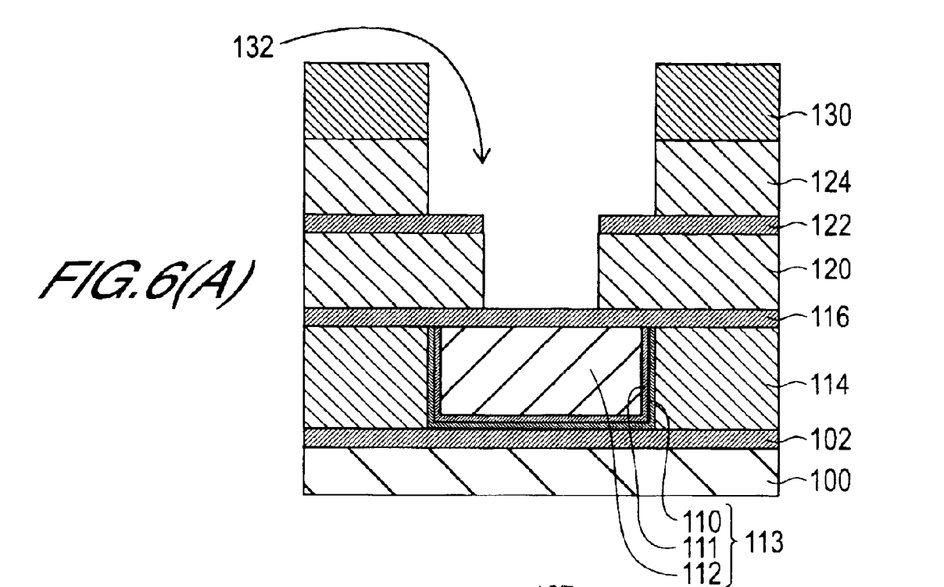
FIGS. 6(A) to 6(B) follow on from FIG. 5(C) and are explanatory views of the multi-layered wiring fabrication process of the third embodiment according to the present invention.
Figure 6B:
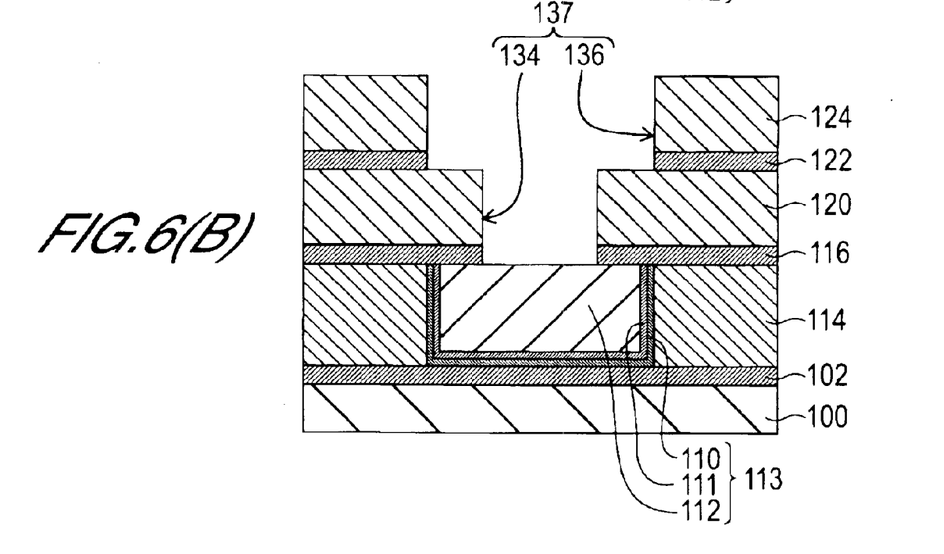

Next, the porous Low-k film 114 is made to fill the region from which the sacrificial oxide film 104 was removed in the same way as in the first embodiment (FIG. 4(B)). Next, the silicon nitride film 116 is deposited as the cap layer (FIG. 4(C)). Subsequently, as per the first embodiment, multi-layered wiring can be formed by repeating the steps from the step of forming the sacrificial oxide film 104 to the step of forming the silicon nitride film 116.

In the second embodiment, by forming the resist pattern 118 as a mask on the wiring 113 which is the wiring layer, the metal wiring is not directly exposed to wetting fluid or plasma when the sacrificial oxide film 104 is removed by wet or dry etching. For this reason, damage to the wiring material caused by wiring oxidation or sputter and so forth can be prevented, whereby a more stable process architecture can be achieved. In addition, similar results to those described for the first embodiment can be obtained.

Third Embodiment

The third embodiment describes a method that involves forming a first wiring layer by means of the method described in the first embodiment and then forming a second wiring layer on this first wiring layer as an integral structure that consists of wiring and a connector plug by processing the sacrificial film by means of a dual-damascene process. The step of forming a via hole and wiring groove by etching the sacrificial film, and the step of then forming the wiring and connector plug as an integral structure correspond to processing by means of a dual-damascene process.

FIGS. 5 to 8 are explanatory views for the multi-layered wiring structure fabrication process according to the third embodiment. The process of forming the first wiring layer is like that of the first embodiment and hence will not be described here. FIG. 5(A) is the cross-sectional view shown in FIG. 2(C), and the wiring 113 is equivalent to the first wiring layer.

Here, the silicon nitride film 116 is a first silicon nitride film, the sacrificial film 104 is a first sacrificial film, and the etching stopper layer 102 is a first etching stopper layer. A sacrificial oxide film 120 used for the formation of the via hole, a silicon nitride film 122 used as an etching stopper of a second wiring groove and a sacrificial oxide film 124 used for the formation of the second wiring groove are sequentially deposited by means of, for example, CVD on the silicon nitride film 116 (FIG. 5(B)). Thereafter, a via hole pattern resist pattern 126 is formed by using a photolithographic technique. The sacrificial oxide film 124 used for the formation of the second wiring groove, the silicon nitride film 122 used as an etching stopper, and the sacrificial oxide film 120 used for the formation of the via hole are all etched to form an opening 128, which is used for the formation of the via hole, above the wiring layer 113 (FIG. 5(C)). Next, the resist pattern 126 is removed and a resist pattern 130 used for the formation of the second wiring groove is patterned on the sacrificial oxide film 124. Then the sacrificial oxide film 124 used for the formation of the second wiring groove is etched to form an opening 132 used for the formation of the second wiring groove (FIG. 6(A)). The resist pattern 130 is removed and cleaning of the inside of the opening 132 is subsequently carried out. Thereafter, with the sacrificial oxide film 124 used for the formation of the second wiring groove and the sacrificial oxide film 120 used for the formation of the via hole serving as a mask, the nitride film 122 used as an etching stopper for the formation of the second wiring groove and the silicon nitride film 116 constituting a cap layer serving to prevent diffusion are etched (FIG. 6(B)). A via hole 134 is thus formed in the silicon nitride film 116 and the sacrificial oxide film 120, and a second wiring groove 136 is formed in the silicon nitride film 122 and the sacrificial oxide film 124. A third opening 137 is constituted by the via hole 134 and the second wiring groove 136 that communicates with the via hole 134. Further, although a via first method constituting one example of a method (dual-damascene process) involving the batchwise formation of the second wiring groove 136 and the via hole 134 by etching is used here, the wiring groove and via hole may be formed by using other techniques.

Figure 7A:
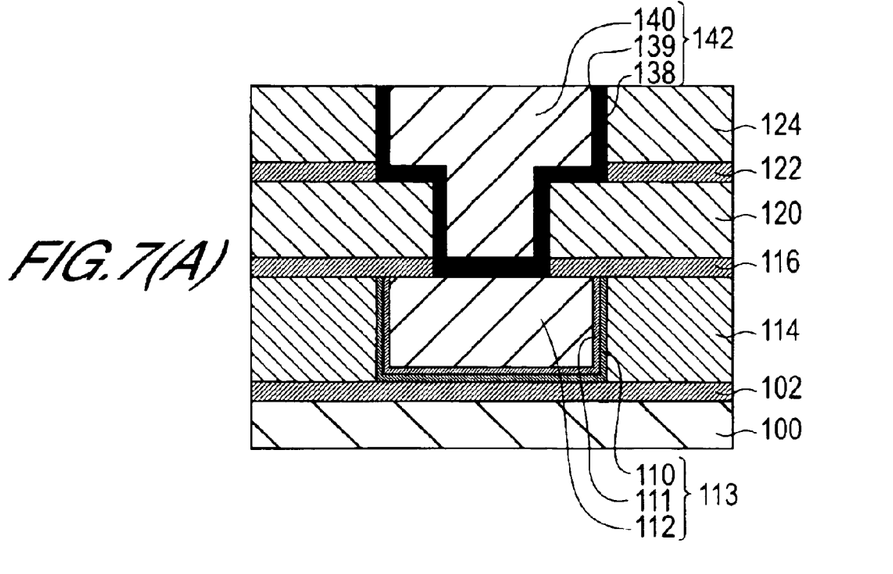
FIGS. 7(A) to 7(B) follow on from FIG. 6(B) and are explanatory views of the multi-layered wiring fabrication process of the third embodiment according to the present invention.

Thereafter, the barrier metal 138, a seed layer (not shown), and a conducting wire layer 140 are sequentially deposited inside the via hole 134 and the second wiring groove 136 to embed the via hole and wiring groove, and the surface of the film deposition layer thus obtained is then made smooth by CMP (FIG. 7(A)). Accordingly, a second wiring layer 142 is constituted by the barrier metal 138, the seed layer 139 and the conductive layer 140. Part of the second wiring layer 142 formed within the via hole is the connector plug and part of the second wiring layer formed within the second wiring groove is second layer wiring.

Figure 7B:
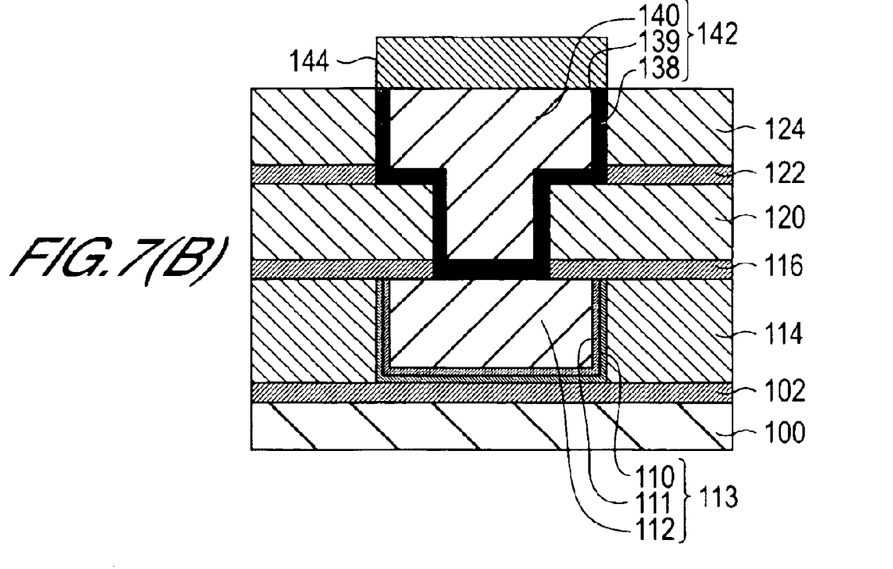

Next, a resist pattern 144 is patterned on the wiring layer 142 by using an inverse mask of the resist pattern used for the formation of the second wiring groove (FIG. 7(B)). Then, with the resist pattern 144 serving as a mask, the sacrificial oxide film 124 used for the second wiring and the silicon nitride film 122 that is used as an etching stopper in the formation of the second wiring groove are each removed by dry etching and the resist pattern 144 is removed under the condition that oxygen is not contained, such as $N_2/N_2$, NH$_3$ (FIG. 8(A)). Next, the sacrificial oxide film 120 used for the formation of the via hole is removed by wet etching using hydrofluoric acid (FIG. 8(B)). Thereafter, a porous Low-k film 146 is deposited as in the first embodiment as an interlayer insulating film for the second wiring layer. Where the method of forming the Low-k film is concerned, although formation by coating is preferred in order to form the Low-k film reliably as far as the sides of the connector plug, when the difference between the widths of the wiring layer and connector plug is small, and so forth, the Low-k film may be formed by using CVD or similar when, depending on the film deposition conditions, film deposition as far as the sides of the connector plug is possible.

Figure 8A:
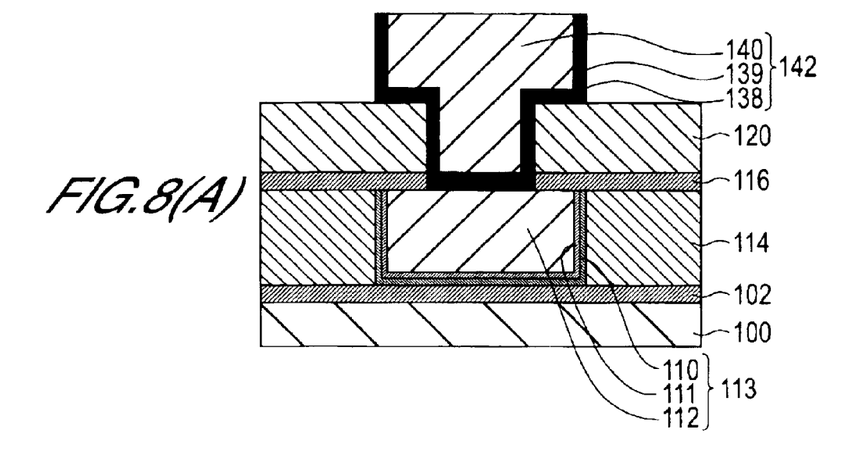
FIGS. 8(A) to 8(C) follow on from FIG. 7(B) and are explanatory views of the multi-layered wiring fabrication process of the third embodiment according to the present invention.
Figure 8B:
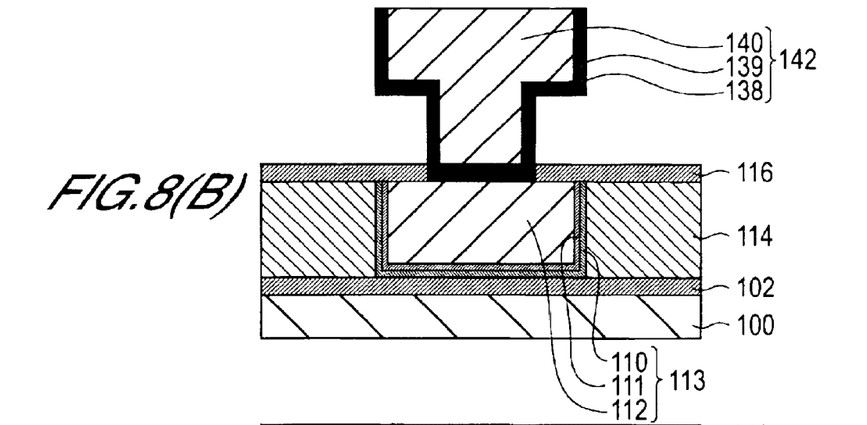
Figure 8C:
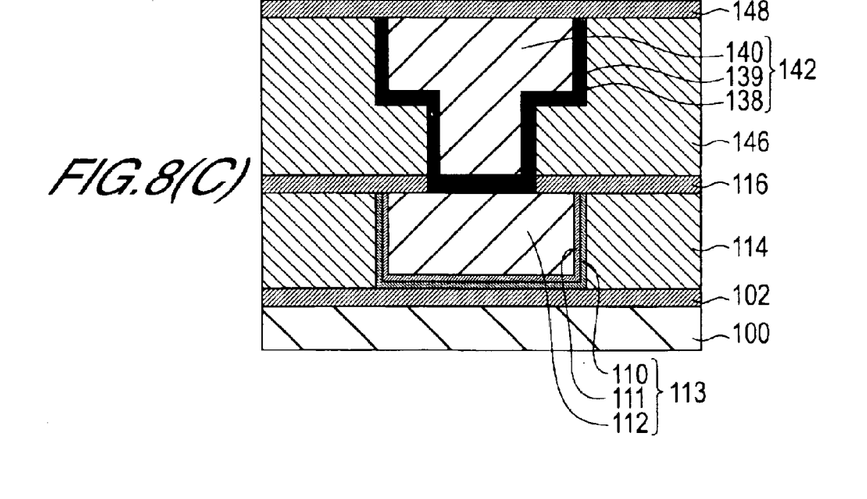

Thereafter, a silicon nitride film 148 is deposited as a cap layer (FIG. 8(C)).

As described above, if the third embodiment of the present invention is used, the porous Low-k film can be formed without being degraded even by means of a dual-damascene process. In addition, because, with previous dual-damascene processes, the wiring groove depth directly affected the wiring resistance, a high precision etching technology rendering a fixed groove (trench) or hole depth was indispensable, and it was necessary to provide an etching stopper layer of high permittivity if depth control according to the etching time interval was inadequate. Here, the above-mentioned etching stopper layer denotes an insulating film that plays the role of terminating the etching at a fixed depth through the placement, below the etched film, of material with a low etching rate (on the order of 1/several tens) with respect to the etched film in order to finish the etching at the desired depth. However, according to the fabrication method of the present invention, the porous Low-k film is deposited after the formation of wiring. That is, depth control by means of the etching stopper layer is performed when etching the sacrificial oxide film 124, and the silicon nitride film 122, which is the etching stopper layer used at this time, is removed following wiring layer formation. Accordingly, the interlayer insulating film is formed by a porous Low-k film once accurate depth control of the wiring layer has been performed. For this reason, the interlayer insulating film can be formed by only the porous Low-k film, without the high permittivity etching stopper layer remaining in the interlayer insulating film. Accordingly, an etching stopper-less dual-damascene in which the porous Low-k film is applied can be implemented, whereby it is possible to fully exploit the characteristics, such as low permittivity, of the porous Low-k film.

According to the fabrication method of the semiconductor device of the present invention, the interlayer insulating film that is constituted by a low permittivity film is formed as a result of being injected following wiring layer formation. Accordingly, there is no exposure to plasma processing or chemical cleaning of the inside of the wiring groove, and it is possible to form a favorable interlayer insulating film that is free of defects by means of a low permittivity film.

What is claimed is:

1. A semiconductor device fabrication method comprising:
    forming a wiring layer by using a sacrificial film, followed by removing said sacrificial film, when forming multi-layered wiring; and
    forming a low permittivity film as an interlayer insulating film in the region in which said sacrificial film is formed;
    wherein said low permittivity film is formed by coating by means of a porous low permittivity film.

2. A semiconductor device fabrication method comprising:
    forming a wiring layer by using a sacrificial film, followed by removing said sacrificial film, when forming multi-layered wiring; and
    forming a low permittivity film as an interlayer insulating film in the region in which said sacrificial film is formed;
    wherein removal of said sacrificial film is performed in a state where the surface of said wiring layer is protected by a protective film.

3. A semiconductor device fabrication method comprising:
    forming a wiring layer by using a sacrificial film, followed by removing said sacrificial film, when forming multi-layered wiring; and
    forming a low permittivity film as an interlayer insulating film in the region in which said sacrificial film is formed;
    wherein said wiring layer is formed as an integral structure that consists of wiring and a connector plug by subjecting said sacrificial film to processing by means of a dual-damascene process.

4. A semiconductor device fabrication method comprising:
    forming a wiring layer by using a sacrificial film, followed by removing said sacrificial film, when forming multi-layered wiring; and
    forming a low permittivity film as an interlayer insulating film in the region in which said sacrificial film is formed;
    wherein said sacrificial film is formed on an etching stopper layer after the etching stopper layer has been formed on lower wiring;
    wherein a wiring groove that reaches said etching stopper layer is formed in said sacrificial film;
    wherein a barrier metal and a seed layer are sequentially formed along the inner wall faces of said wiring groove; and
    wherein said wiring layer is formed on said seed layer such that the wiring groove is embedded and so as to have a surface height that is at the same level as the surface of the sacrificial film.

5. A semiconductor device fabrication method comprising:
    forming a wiring layer by using a sacrificial film, followed by removing said sacrificial film, when forming multi-layered wiring; and
    forming a low permittivity film as an interlayer insulating film in the region in which said sacrificial film is formed;
    wherein a cap layer is provided on said wiring layer and the interlayer insulating film; and
    wherein the formation of said wiring layer, the removal of said sacrificial film and the formation of said interlayer insulating film are repeated on said cap layer by using the cap layer as an etching stopper layer.

6. The semiconductor device fabrication method according to claim 4, wherein:
    said etching stopper layer is formed by being deposited as a silicon nitride film;

said sacrificial film is formed by being deposited as a silicon oxide film;

said barrier metal is formed by sputtering as tantalum nitride;

said seed layer is formed by sputtering as a copper seed layer; and said wiring layer is formed by electrolytic plating as a copper electrolytic plating film.

7. A semiconductor device fabrication method comprising:

forming a wiring layer by using a sacrificial film, followed by removing said sacrificial film, when forming multi-layered wiring; and forming a low permittivity film as an interlayer insulating film in the region in which said sacrificial film is formed;

wherein said interlayer insulating film is deposited by means of spin coating.

8. The semiconductor device fabrication method according to claim 2, wherein:

a resist pattern is formed as said protective film on said wiring layer by using a photolithography technique.

9. The semiconductor device fabrication method according to claim 3, wherein:

a first cap layer is provided on said wiring layer and interlayer insulating film;

a second sacrificial film, a second etching stopper film, and a third sacrificial film are sequentially deposited on said first cap layer;

a first opening that extends from the surface of said third sacrificial film to the surface of said first cap layer is formed above said wiring layer;

a second opening that extends from the surface of said third sacrificial film to the surface of said second etching stopper layer and is broader than said first opening is formed;

a second wiring groove is formed by removing the part of said second etching stopper layer which is exposed to said second opening, with the remaining portion of said third sacrificial film serving as a mask;

a via hole is formed by removing the part of said first etching stopper layer which is exposed to said first opening, with the remaining portion of said second sacrificial film serving as a mask; and a second electrically conductive layer that embeds a third opening is formed on a second seed layer after a second barrier metal and said second seed layer have been sequentially formed on the inner wall faces of said third opening that consists of the via hole and said second wiring groove that communicates with said via hole.

10. The semiconductor device fabrication method according to claim 9, wherein the removal of the exposed part of said second etching stopper layer and the removal of the exposed part of said first etching stopper layer are etched batchwise.

* * * * *